US012593403B2

(12) United States Patent
Lee et al.

(10) Patent No.: US 12,593,403 B2
(45) Date of Patent: Mar. 31, 2026

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Youn Gyu Han, Suwon-si (KR); Jin Won Lee, Suwon-si (KR); Da Yeon Lee, Suwon-si (KR); Yong Duk Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 551 days.

(21) Appl. No.: 18/099,333

(22) Filed: Jan. 20, 2023

(65) Prior Publication Data

US 2024/0057254 A1     Feb. 15, 2024

(30) Foreign Application Priority Data

Aug. 10, 2022     (KR) ......................... 10-2022-0099857

(51) Int. Cl.
 *H05K 1/11* (2006.01)
 *H05K 1/181* (2026.01)
(52) U.S. Cl.
 CPC .............. *H05K 1/111* (2013.01); *H05K 1/115* (2013.01); *H05K 1/181* (2013.01); *H05K 2201/10325* (2013.01)

(58) Field of Classification Search
CPC ......... H05K 1/111; H05K 1/115; H05K 1/185
USPC .......................................................... 361/783
See application file for complete search history.

(56) References Cited

U.S. PATENT DOCUMENTS

| | | | |
|---|---|---|---|
| 2020/0294921 A1 | 9/2020 | Liu et al. | |
| 2021/0082797 A1 | 3/2021 | Lee et al. | |
| 2022/0115393 A1* | 4/2022 | Yu | H10B 41/27 |
| 2022/0328553 A1* | 10/2022 | Oh | H10F 39/811 |

FOREIGN PATENT DOCUMENTS

KR     10-2018-0136926 A     12/2018

OTHER PUBLICATIONS

Korean Office Action dated Dec. 19, 2025 issued in Korean Patent Application No. 10-2022-0099857 (with English translation).

* cited by examiner

*Primary Examiner* — Andargie M Aychillhum
(74) *Attorney, Agent, or Firm* — Morgan Lewis & Bockius LLP

(57) ABSTRACT
A printed circuit board includes a substrate, a first pad and a second pad, respectively disposed on an upper side of the substrate, a first socket disposed in the substrate and including a first circuit, and a first trace disposed in the substrate and disposed between the first and second pads and the first socket with respect to a lamination direction. At least a portion of the first circuit is electrically connected to each of the first and second pads, and is electrically connected to the second pad through a path passing through the first trace.

26 Claims, 13 Drawing Sheets

100C-1

100C-2

PRINTED CIRCUIT BOARD

CROSS-REFERENCE TO RELATED APPLICATION(S)

This application claims benefit of priority to Korean Patent Application No. 10-2022-0099857 filed on Aug. 10, 2022 in the Korean Intellectual Property Office, the disclosure of which is incorporated herein by reference in its entirety.

TECHNICAL FIELD

The present disclosure relates to a printed circuit board.

BACKGROUND

With a rapid increase in the number of central processing unit (CPU) and graphics processing unit (GPU) cores in server products, die-splitting technology, capable of effectively increasing the number of cores, has become commonplace. In addition, with the increasing demand for a package including a high bandwidth memory (HBM), a technology for die-to-die connection with a fine circuit line width has been required. To satisfy such technical requirements, a technology using a silicon interposer, or the like, has been developed, but there is a limitation in commercialization thereof due to price issues and complicated assembly processes. In addition, technologies for embedding a silicon bridge in a substrate have been developed, but embedding of a bridge suffers from a limitation in which dies to be connected should be close to each other. For example, the degree of freedom in arrangement of the dies is reduced.

SUMMARY

An aspect of the present disclosure is to provide a printed circuit board in which a socket for increasing the degree of freedom in disposition of a die (or a semiconductor chip) is embedded.

One of the solutions proposed by the present disclosure is to embed a socket, connected to a die (or a semiconductor chip) through a path passing through a trace, in a substrate.

According to an aspect of the present disclosure, a printed circuit board includes a substrate, a first pad and a second pad, respectively disposed on an upper side of the substrate, a first socket disposed in the substrate and including a first circuit, and a first trace disposed in the substrate and disposed between the first and second pads and the first socket with respect to a lamination direction of insulating layers of the substrate. At least a portion of the first circuit is connected to each of the first and second pads, and is connected to the second pad through a path passing through the first trace.

According to another aspect of the present disclosure, a printed circuit board includes a substrate including insulating layers, a wiring layer, and a via layer, and a first socket embedded in the substrate and including a first circuit. The via layer includes a plurality of first vias and a plurality of second vias. The first socket includes a plurality of first connection pads and a plurality of second connection pads. The plurality of first vias and the plurality of second vias contact the plurality of first connection pads and the plurality of second connection pads, respectively. An average pitch between the plurality of second connection pads is greater than an average pitch between the plurality of first connection pads.

According to another aspect of the present disclosure, a printed circuit board includes a substrate including insulting layers, a plurality of pads disposed on one surface of the substrate, and a socket disposed in the substrate and including a plurality of connection pads disposed on a surface of the socket. The plurality of connection pads include a first connection pad connected to a first pad of the plurality of pads through a path extending in a lamination direction of the insulating layers, and a second connection pad connected to a second pad of the plurality of pads. The second connection pad is offset from the plurality of pads in the lamination direction.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, exemplary embodiments of the present disclosure will be described in detail with reference to the accompanying drawings.

Electronic Device

Figure 1:
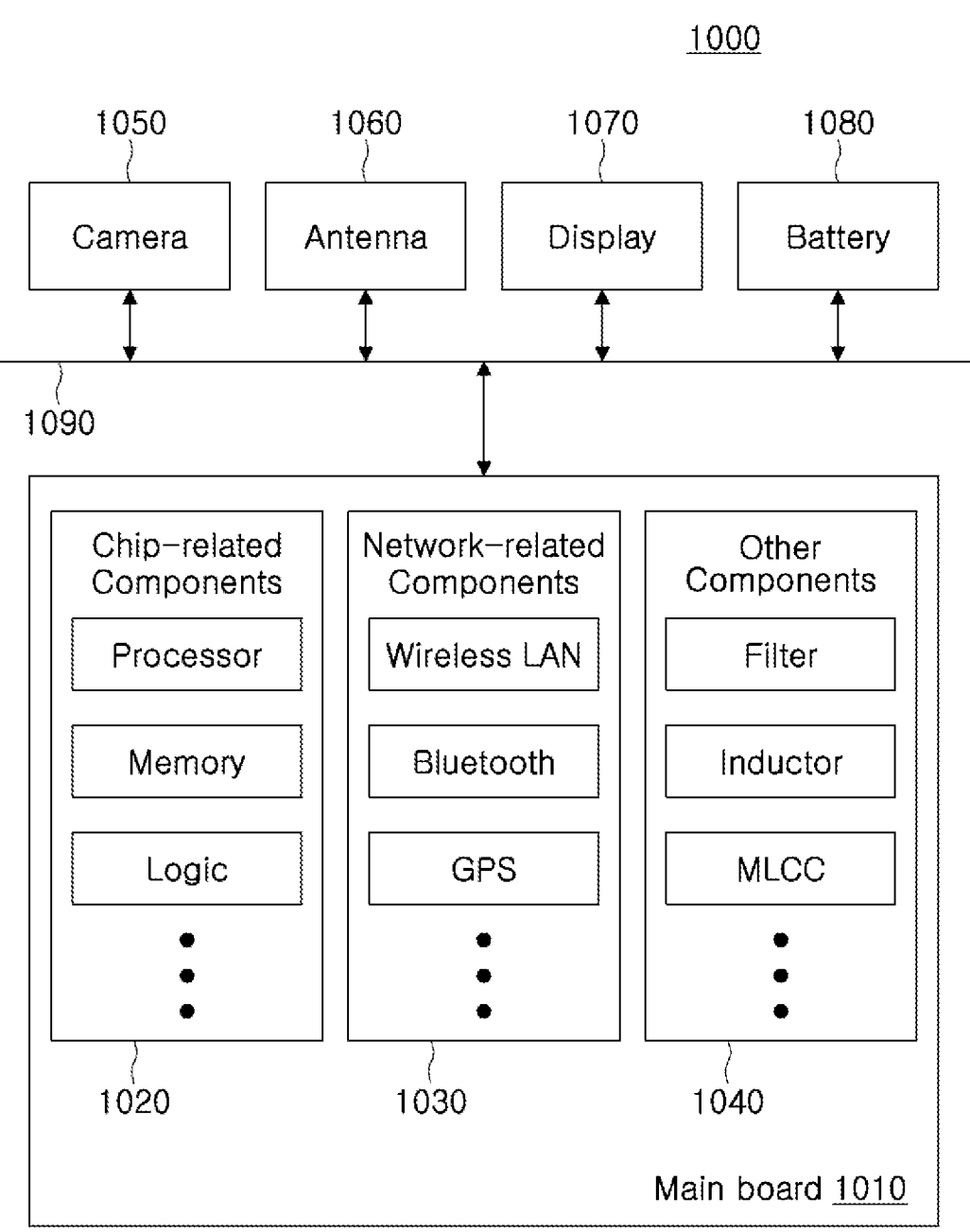
FIG. 1 is a schematic block diagram illustrating an example of an electronic device system.

FIG. 1 is a schematic block diagram illustrating an example of an electronic device system.

Referring to the drawing, an electronic device 1000 may accommodate a mainboard 1010. The mainboard 1010 is physically and/or electrically connected to a chip-related component 1020, a network-related component 1030, other components 1040 or the like. These components may be also coupled to other components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related components.

In addition, these chip-related components may be combined with each other. The chip-related components 1020 may be in the form of a package including the chips described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020.

The other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
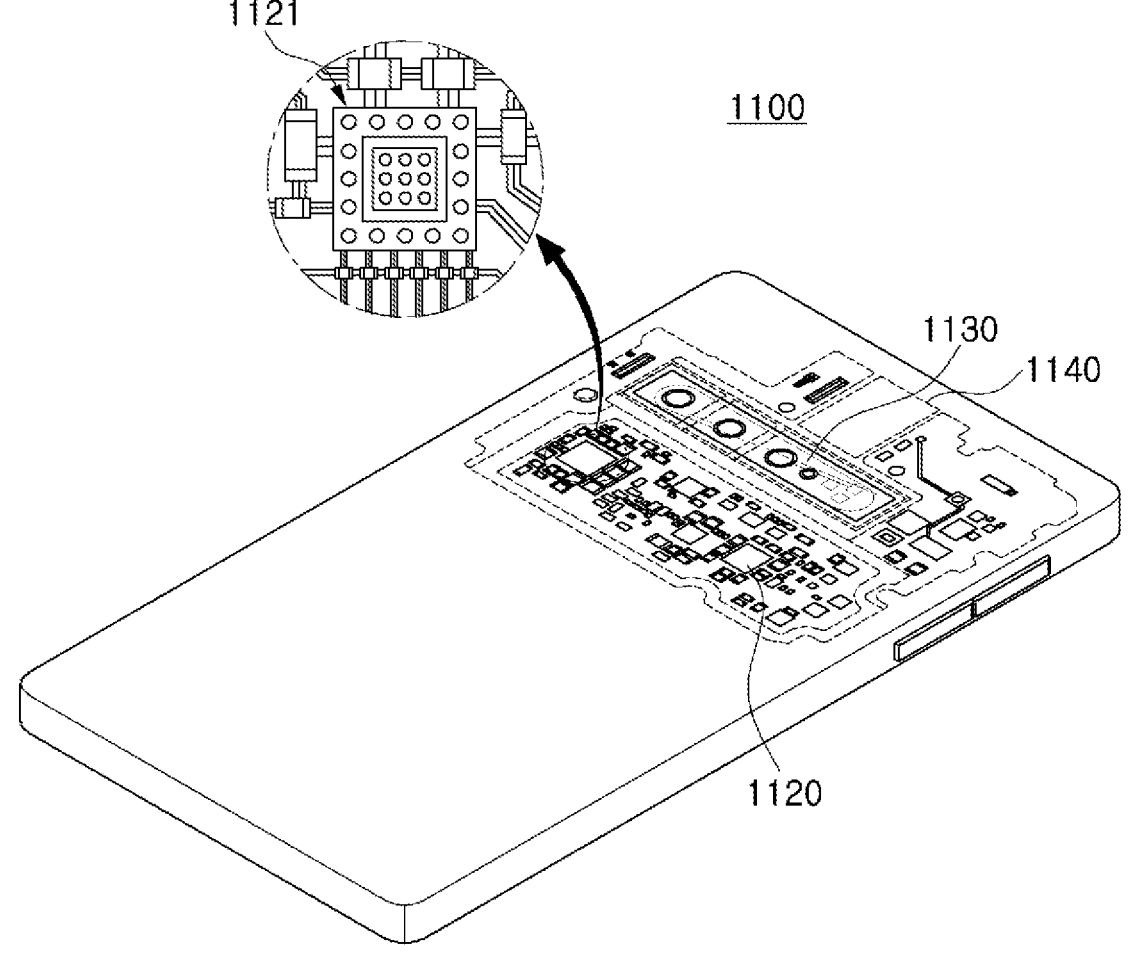
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130, a speaker 1140, and/or the like may also be accommodated in the motherboard 1110. Some of the electronic components 1120 may be the above-described chip-related components, e.g., a printed circuit board 1121 with a plurality of electronic components mounted on a surface thereof, but are not limited thereto. Meanwhile, the electronic device is not necessarily limited to the smartphone 1100, but may be any other electronic device as described above.

Semiconductor Package Including Interposer

In general, scores of microelectronic circuits may be integrated in a semiconductor chip, but the semiconductor chip itself may not serve as a finished product of a semiconductor, and may be damaged by an external physical or chemical impact. Accordingly, the semiconductor chip itself may not be used as it is. For this reason, the semiconductor chip may be packaged and thus has been used for electronic devices, or the like, in a packaged state.

The semiconductor packaging is required because there is a difference in circuit widths between the semiconductor chip and the mainboard of the electronic device in terms of an electrical connection. For example, in the case of the semiconductor chip, a size of connection pads and an interval between the connection pads are significantly small. On the other hand, in the case of the mainboard used for the electronic device, a size of component mounting pads and an interval between the component mounting pads may be significantly larger than a scale of the semiconductor chip. Accordingly, there is a need for a packaging technology, capable of buffering the difference in circuit widths between the semiconductor chip and the mainboard because it is difficult to directly mount the semiconductor chip on the ma inboard.

Hereinafter, a semiconductor package including an organic interposer manufactured by such a packaging technique will be described in more detail with reference to the drawings.

Figure 3:
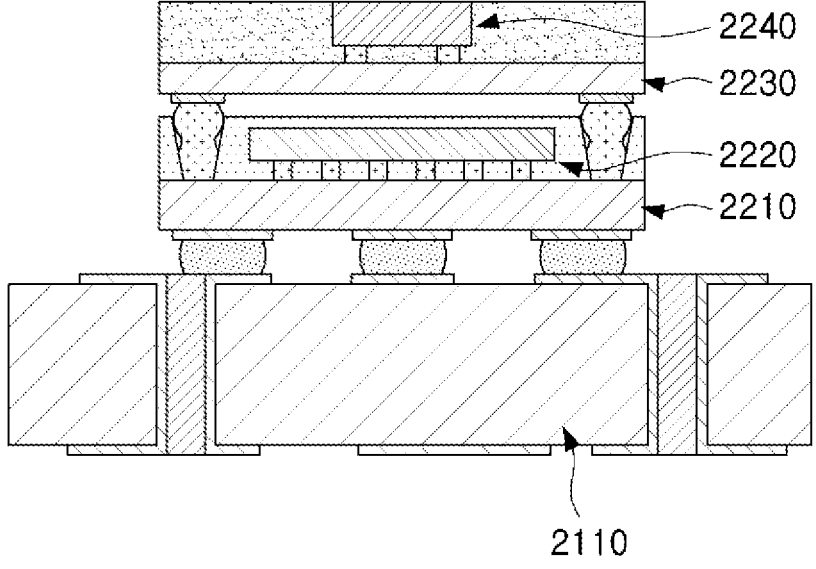
FIG. 3 is a schematic cross-sectional view illustrating a case in which a BGA package is mounted on a mainboard of an electronic device.

FIG. 3 is a schematic cross-sectional view illustrating a case in which a ball grid array (BGA) package is mounted on a mainboard of the electronic device.

It is significantly important to perform packaging at a high yield because each chip of an application specific integrated circuit (ASIC) such as a graphics processing unit (GPU) of a semiconductor chip is significantly expensive. For this purpose, a BGA substrate 2210, or the like, capable of redistributing thousands to hundreds of thousands of connection pads before mounting the semiconductor chip may be prepared, and then an expensive semiconductor chip such as a GPU 2220 may be mounted on the BGA substrate 2210 by a surface mounting technology (SMT) or the like and packaged, and finally mounted on a mainboard 2110.

In the case of the GPU 2220, there is a need to significantly reduce a signal path to a memory such as a high bandwidth memory (HBM). To this end, the semiconductor chip such as an HBM 2240 may be mounted on the interposer 2230 and then packaged, and may be used by being stacked on the package on which the GPU 2220 is mounted in a package-on-package (POP) manner. However, in this case, a thickness of the device may be significantly increased, and it may be difficult to significantly reduce the signal path.

Figure 4:
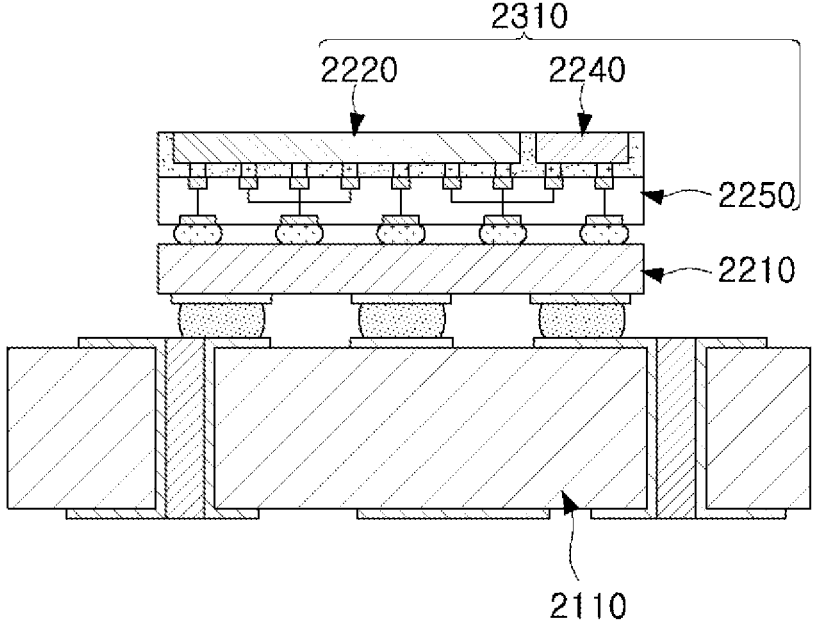
FIG. 4 is a schematic cross-sectional view illustrating a case in which a silicon interposer package is mounted on a mainboard.

FIG. 4 is a schematic cross-sectional view illustrating a case in which a silicon interposer package is mounted on a mainboard.

To address the above-described issues, a semiconductor package 2310 including a silicon interposer may be manufactured by an interposer technology of surface-mounting a first semiconductor chip such as a GPU 2220 and a second semiconductor chip such as an HBM 2240 on a silicon interposer 2250 side-by-side and then packaging the first semiconductor chip and the second semiconductor chip. In this case, the GPU 2220 and the HBM 2240 having thousands to hundreds of thousands of connection pads may be redistributed through the interposer 2250, and may be electrically connected by a minimum path. In addition, when the semiconductor package 2310 including such a silicon interposer is mounted on the BGA substrate 2210, or the like, again and distributed, the semiconductor package 2310 may finally be mounted on the mainboard 2110.

However, in the case of the silicon interposer 2250, it may be difficult to form a through-silicon via (TSV) and manufacturing costs may also be significantly high, which is disadvantageous for large-scale and low-cost manufacturing.

Figure 5:
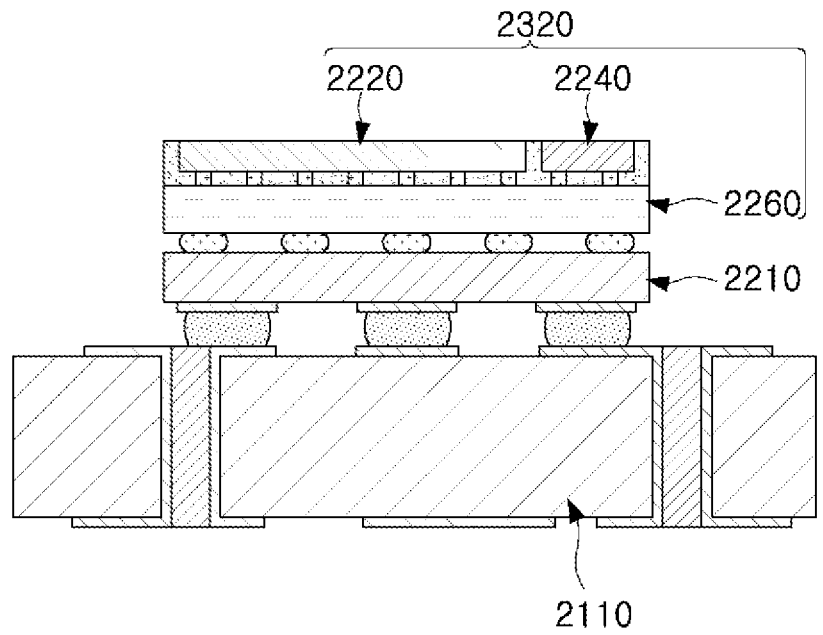
FIG. 5 is a schematic cross-sectional view illustrating a case in which an organic interposer package is mounted on a mainboard.

FIG. 5 is a schematic cross-sectional view illustrating a case in which an organic interposer package is mounted on a mainboard.

As a method for addressing the above-described issues, use of an organic interposer 2260, rather than the silicon interposer 2250, may be taken into consideration. For example, a semiconductor package 2320 including an organic interposer may be manufactured by an interposer technology of surface-mounting a first semiconductor chip such as the GPU 2220 and a second semiconductor chip such as the HBM 2240 on an organic interposer 2260 side-by-side and packaging the first semiconductor chip and the second semiconductor chip. In this case, the GPU 2220 and the HBM 2240 having thousands to hundreds of thousands of connection pads may be redistributed through the interposer 2260, and may be electrically connected by a minimum path. In addition, when the semiconductor package 2320 including such an organic interposer is mounted on the BGA substrate 2210, or the like, again and distributed, the semiconductor package 2310 may finally be mounted on the mainboard 2110. In addition, it is advantageous for large-scale and low-cost manufacturing.

However, in the case in which the organic interposer 2260 is used, the semiconductor chips 2220 and 2240 should be mounted on the organic interposer 2260, and then mounted again on the BGA substrate 2210. Therefore, a process may be somewhat complicated, and packaging yield may be reduced.

Printed Circuit Board in which Socket is Embedded

Figure 6:
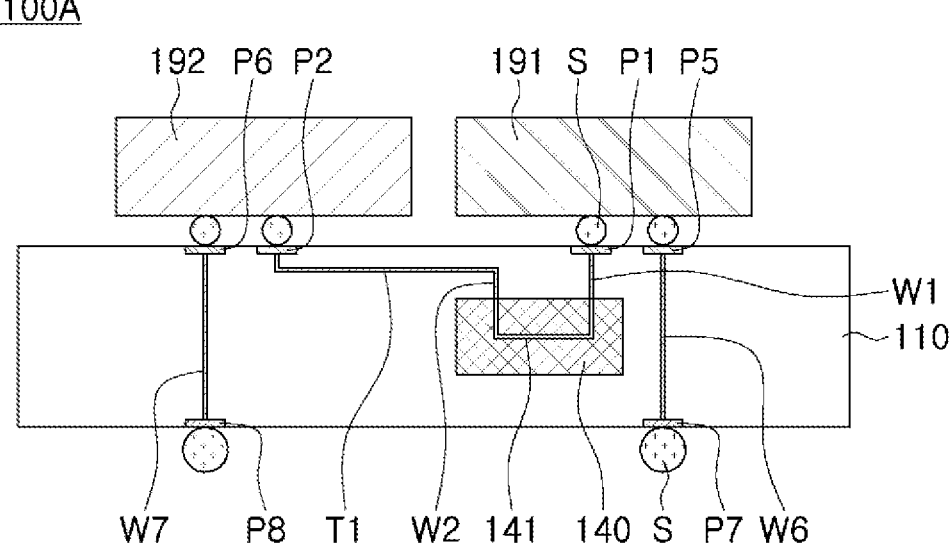
FIG. 6 is a schematic cross-sectional view illustrating an example of a printed circuit board.

FIG. 6 is a schematic cross-sectional view illustrating an example of a printed circuit board.

Figure 7:
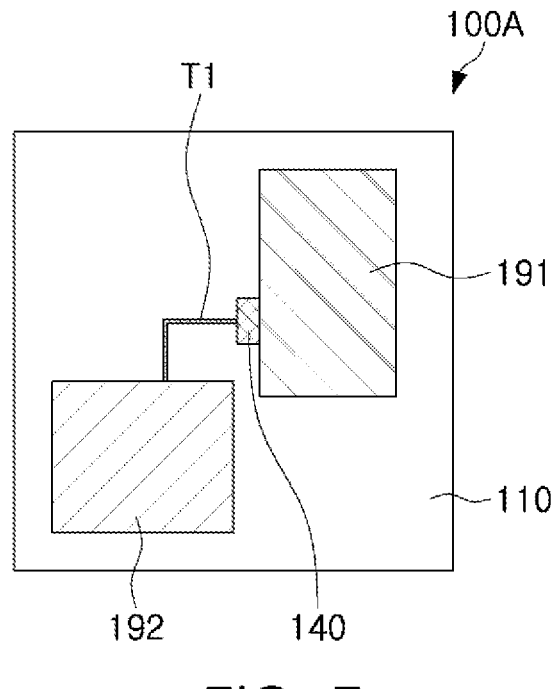
FIG. 7 is a schematic perspective plan view of the printed circuit board of FIG. 6.

FIG. 7 is a schematic perspective plan view of the printed circuit board of FIG. 6.

Referring to the drawings, a printed circuit board 100A according to an example may include a substrate 110, first and second pads P1 and P2, respectively disposed on an upper side of the substrate 110, a socket 140 disposed in the substrate 110 and including a circuit 141, and a first trace T1 disposed in the substrate 110 and disposed between the first and second pads P1 and P2 and the socket 140 with respect to a lamination direction. The socket 140 may be an electrical socket, a socket outlet, and/or an outlet.

At least a portion of the circuit 141 may be electrically connected to the first and second pads P1 and P2 through the first and second paths W1 and W2 in the substrate 110, and may be electrically connected to the second pad P2 through the second path W2 passing through at least the first trace T1. Each of the first and second paths W1 and W2 may include a trace, a pad, a via, and the like, and the trace, the pad, the via, and the like, may include a metal material. For example, each of the first path W1 may include a pad, a via, or the like, and the second path W2 may include a trace, a pad, a via, or the like, but exemplary embodiments are not limited thereto.

First and second semiconductor chips 191 and 192, respectively electrically connected to the first and second pads P1 and P2, may be disposed on the substrate 110. The first and second semiconductor chips 191 and 192 may be connected to the first and second pads P1 and P2 through solder balls S, respectively, but exemplary embodiments are not limited thereto. As a result, the first and second semiconductor chips 191 and 192 may be electrically connected to each other through the first and second paths W1 and W2 and the socket 140. When the first and second semiconductor chips 191 and 192 are mounted, the printed circuit board 100A may have a semiconductor package structure. With respect to the lamination direction, the socket 140 may at least partially overlap the first pad P1 and the first semiconductor chip 191 and may be spaced apart from the second pad P2 and the second semiconductor chip 192. For example, the second semiconductor chip 192 may be disposed to be spaced apart from the socket 140, resulting in an improved degree of freedom in disposition. In other words, the second semiconductor chip 192 may be disposed to be offset from the socket 140 with respect to the lamination direction. In one example, the second semiconductor chip 192 may not overlap the socket 140 with respect to the lamination direction.

The first and second semiconductor chips 191 and 192 may also be electrically connected to fifth and sixth pads P5 and P6 disposed on the upper side of the substrate 110, respectively.

In addition, the first and second semiconductor chips 191 and 192 may be electrically connected to seventh and eighth pads P7 and P8, disposed on a lower side of the substrate 110, through sixth and seventh paths W6 and W7, respectively. Each of the sixth and seventh paths W6 and W7 may include a trace, a pad, a via, and the like, and the trace, the pad, and the via may include a metal material. For example, each of the sixth and seventh paths W6 and W7 may include a pad and a via, but exemplary embodiments are not limited thereto. A solder ball S may be attached to each of the fifth to eighth pads P5, P6, P7, and P8, but exemplary embodiments are not limited thereto.

Figure 8:
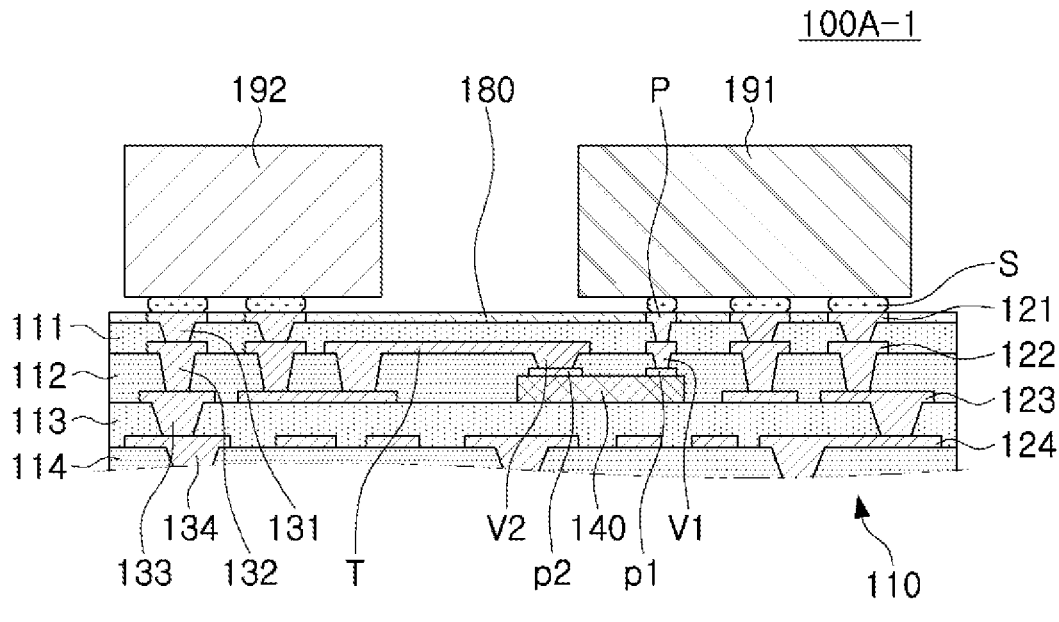
FIGS. 8 to 10 are schematic cross-sectional views illustrating various wiring structures of the printed circuit board of FIG. 6.
Figure 9:
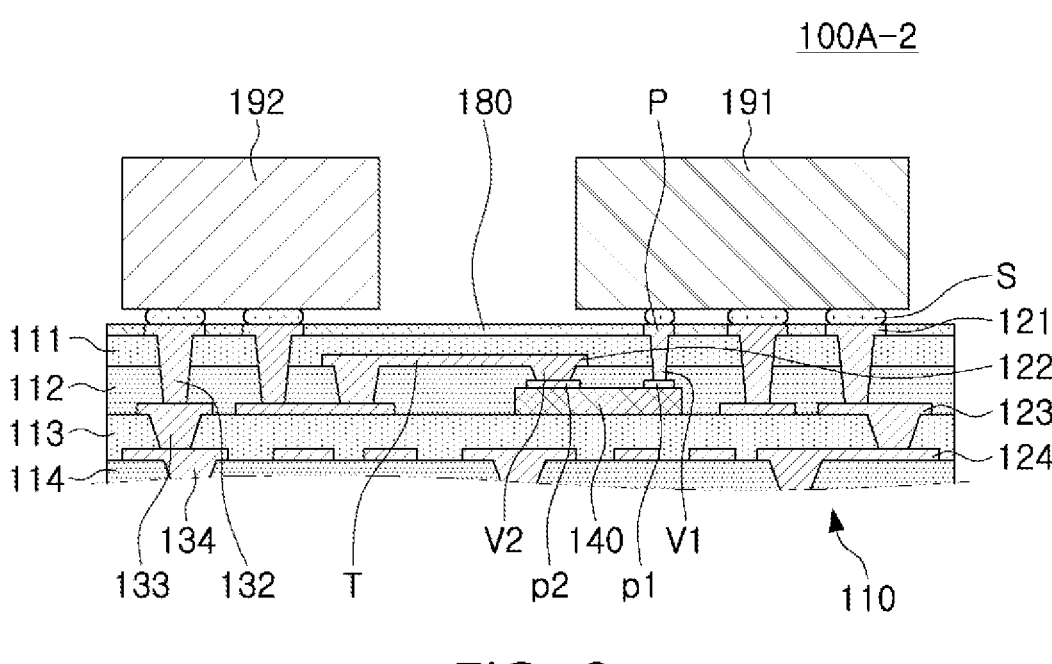
Figure 10:
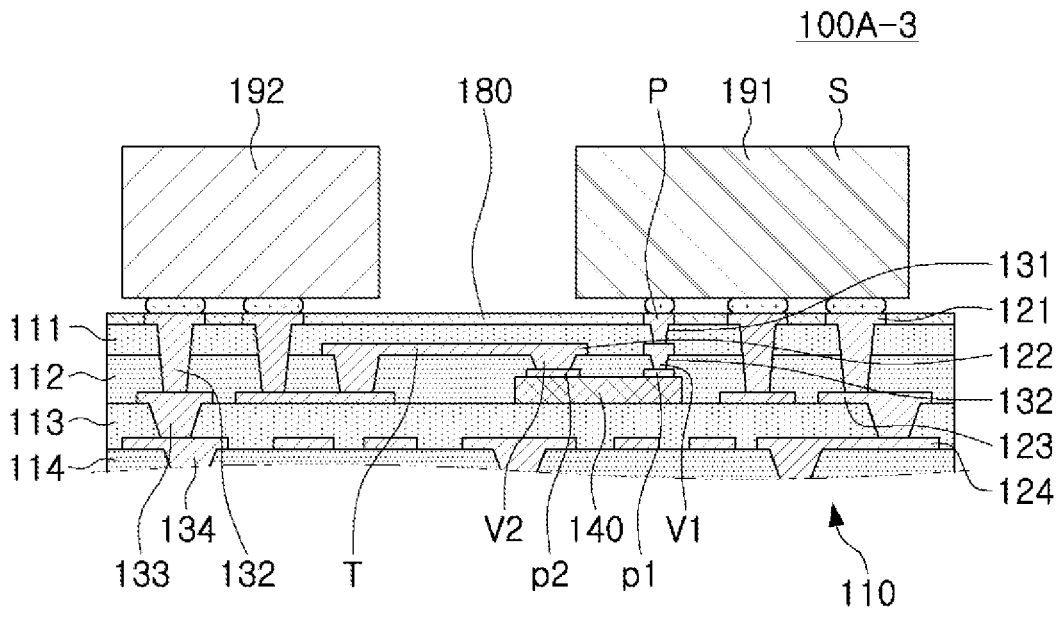

FIGS. 8 to 10 are schematic cross-sectional views illustrating various wiring structures of the printed circuit board of FIG. 6.

Referring to the drawings, printed circuit boards 100A-1, 100A-2, and 100A-3 according to various embodiments may each include a substrate 110, including insulating layers 111, 112, 113, and 114, wiring layers 121, 122, 123, and 124, and via layers 131, 132, 133, and 134, and a socket 140 embedded in the substrate 110 and including first and second connection pads p1 and p2. As necessary, each of the printed circuit boards 100A-1, 100A-2, and 100A-3 may further include a resist layer 180 disposed on the insulating layers 111, 112, 113, and 114. As necessary, each of the printed circuit boards 100A-1, 100A-2, and 100A-3 may further include the first and second semiconductor chips 191 and 192, respectively mounted on the substrate 110 through solder balls S.

Each of the printed circuit board 100A-1, 100A-2, and 100A-3 may be in the form of a core substrate in which the insulating layers 111, 112, 113, and 114, the wiring layers 121, 122, 123, and 124, and the via layers 131, 132, 133, and 134 are respectively built up, and a portion of an upper side thereof is illustrated in the drawings. However, exemplary embodiments are not limited thereto, and each of the printed circuit board 100A-1, 100A-2, and 100A-3 may be in the form of a coreless substrate, as necessary.

The wiring layers 121, 122, 123, and 124 may include a trace T. The via layers 131, 132, 133, and 134 may include first and second vias V1 and V2, respectively contacting the first and second connection pads p1 and p2. The second connection pad p2 may be electrically connected to the trace T through a path passing through at least the second via V2. The first connection pad p1 may be electrically connected to the first semiconductor chip 191 through a path passing through at least the first via V1. The trace T may be electrically connected to the second semiconductor chip 192 via at least a portion of the wiring layers 121, 122, 123, and 124 and at least a portion of the via layers 131, 132, 133 and 134 in the substrate 110.

The via layers 131, 132, 133, and 134 may be formed in various shapes. For example, as in the printed circuit board 100A-1, each of the via layers 131, 132, 133, and 134 may be formed to penetrate through each of the insulating layers 111, 112, 113, and 114. Alternatively, as in the printed circuit board 100A-2, the first via layer 131 may be omitted, and a portion of the second via layer 132 may be formed to penetrate through the first and second insulating layers 111 and 112 in a batch. Alternatively, as in the printed circuit board 100A-3, a portion of the first via layer 131 and a portion of second via layer 132 may be formed to penetrate through the first and second insulating layers 111 and 112, respectively, and another portion of the second via layer 132 may be formed to penetrate through the first and second insulating layers 111 and 112 in a batch.

Each of the first and second vias V1 and V2 and the first and second connection pads p1 and p2 may be provided in plural. With respect to the lamination direction of the insulating layers 111, 112, 113, and 114, at least a portion of the plurality of first connection pads p1 may overlap the first semiconductor chip 191 and may be spaced apart from the second semiconductor chip 192. In one example, at least a portion of the plurality of second connection pads p2 may be disposed to be offset from or to not overlap the second semiconductor chip 192 with respect to the lamination direction. As will be described later, the plurality of first connection pads p1 may be disposed to correspond to the plurality of first pads of the substrate, and the plurality of second connection pads p2 may be disposed to not correspond to the plurality of second pads of the substrate.

Hereinafter, the components of the printed circuit board 100A-1, 100A-2, and 100A-3 according to various embodiments will be described in more detail with reference to accompanying drawings.

Each of the insulating layers 111, 112, 113, and 114 may include an insulating material. An example of the insulating material may include a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, an Ajinomoto Build-up Film (ABF), prepreg, or the like. As a non-limiting example, the insulating layers 111, 112, 113, and 114 may include substantially the same insulating material, for example, an ABF, but exemplary embodiments are not limited thereto. Substantially the same insulating material may be the case in which insulating materials of the same brand name are used. The number of the insulating layers 111, 112, 113, and 114 is not limited, and may be more or less than that illustrated in the drawings.

Each of the wiring layers 121, 122, 123, and 124 may include a metal material. An example of the metal material may include copper (Cu), aluminum (Al), silver (Ag), tin (Sn), gold (Au), nickel (Ni), lead (Pb), titanium (Ti), or alloys thereof. Each of the wiring layers 121, 122, 123, and 124 may include an electroless plating layer (or chemical copper) and an electrolytic plating layer (or electrolytic copper), but exemplary embodiments are not limited thereto. As necessary, each of the wiring layers 121, 122, 123, and 124 may further include a copper foil. The number of the wiring layers 121, 122, 123, and 124 is not limited, and may be more or less than that illustrated in the drawings. Each of the wiring layers 121, 122, 123, and 124 may perform various functions depending on a design of a corresponding layer. For example, each of the wiring layers 121, 122, 123, and 124 may include a ground pattern, a power pattern, a signal pattern, or the like. The signal pattern may include various signals, other than the ground pattern and the power pattern, for example, a data signal. Each of the patterns may include a trace, a pad, a plane, and the like. For example, the first wiring layer 121 may include a plurality of pads P. In addition, the second wiring layer 122 may include a trace T.

Each of the via layers 131, 132, 133, and 134 may include a metal material. An example of the metal material may include copper (Cu), aluminum (Al), silver (Ag), tin (Sn), gold (Au), nickel (Ni), lead (Pb), titanium (Ti), or alloys thereof. Each of the via layers 131, 132, 133, and 134 may include an electroless plating layer (or chemical copper) and an electrolytic plating layer (or electrolytic copper), but exemplary embodiments are not limited thereto. Each of the via layers 131, 132, 133, and 134 may be a filled-type via layer in which a via hole is filled with a metal material, but exemplary embodiments are not limited thereto. Alternatively, each of the via layers 131, 132, 133, and 134 and may be a conformal-type via layer in which a metal material is disposed along a wall surface of a via hole. Each of the via layers 131, 132, 133, and 134 may have a tapered shape in which a width of an upper surface is greater than a width of a lower surface in a cross-section, and all of the via layers 131, 132, 133, and 134 may have shapes tapered in the same direction, but exemplary embodiments are not limited thereto. Each of the via layers 131, 132, 133, and 134 may perform various functions depending on a corresponding layer. For example, each of the via layers 131, 132, 133, and 134 may include a via for grounding, a via for power, a via for a signal, or the like. Here, the via for a signal may include a via for transmitting various signals, other than the via for grounding and the via for power, for example, a data signal.

The socket 140 may be a silicon socket manufactured by forming an insulating body of a silicon dioxide and forming a wiring through a deposition process, an organic socket manufactured by forming an insulating body of an organic insulating material and forming a wiring through a plating process, or the like. The socket 140 may be, in detail, an organic socket. In this case, reliability issues caused by coefficient of thermal expansion (CTE) mismatching may rarely occur. In addition, process difficulty and costs for manufacturing the socket 140 may be reduced. The socket 140 may have an embedded trace substrate (ETS) structure. An example of the organic insulating material may include a photoimageable dielectric (PID) material, but exemplary embodiments are not limited thereto. As the organic insulating material, an ABF may be used.

The socket 140 may provide a die-to-die interconnection path. To this end, a circuit may be disposed inside the socket 140. The circuit may include a circuit layer and a via layer. Each of the circuit layer and the via layer include a plurality of layers. The circuit may perform various functions depending on a design of a corresponding layer, and may include at least a signal pattern. The circuit may include a metal material such as copper (Cu), aluminum (Al), silver (Ag), tin (Sn), gold (Au), nickel (Ni), lead (Pb), titanium (Ti), or alloys thereof. The circuit may include a circuit having a fine pitch. For example, the circuit may have high circuit density, as compared with the wiring layers 121, 122, 123, and 124. For example, the circuit may include a higher-density circuit. For example, an average pitch of the circuit may be smaller. In addition, an average insulation distance between layers may be smaller.

When a thickness of the socket 140 is high, the insulating layers 111, 112, 113, and 114 may be formed to have a cavity and the socket 140 may then be embedded in the cavity. When a thickness of the socket 140 is low, the insulating layers 111, 112, 113, and 114 may embed the socket 140 without formation of a cavity.

The resist layer 180 may be disposed on an outermost side of the printed circuit board 100A-1, 100A-2, or 100A-3 to protect internal components. A material of the resist layer 180 is not limited. For example, the material of the resist layer 180 may be an insulating material. In this case, a solder resist may be used as the insulating material. However, exemplary embodiments are not limited thereto. The resist layer 180 may have a plurality of openings, respectively exposing the pads P.

Each of the semiconductor chips 191 and 192 may be an integrated circuit (IC) die in which hundreds to millions of devices are integrated in a single chip. The integrated circuit may be, for example, a processor chip such as a central processor (for example, a CPU), a graphics processor (for example, a GPU), a field programmable gate array (FPGA), a digital signal processor, a cryptographic processor, a microprocessor, or a microcontroller, an application processor (for example, an AP), a logic chip such as an analog-to-digital converter or an application-specific IC (ASIC), or the like, but exemplary embodiments are not limited thereto. Each of the semiconductor chips 191 and 192 may be a memory chip such as a volatile memory (for example, a dynamic random access memory (DRAM)), a nonvolatile memory (for example, a read-only memory (ROM)), a flash memory, a high bandwidth memory (HBM), or the like, or another type of chip such as a power management IC (PMIC). For example, the first semiconductor chip 191 may include a logic chip such as a GPU, and the second semiconductor chip 192 may include a memory chip such as an HBM. The first and second semiconductor chips 191 and 192 may be split logic chips split by dip split to have different cores.

Each of the semiconductor chips 191 and 192 may be formed based on an active wafer. In this case, silicon (Si), germanium (Ge), gallium-arsenide (GaAs), or the like, may be used as a base material forming a body of each of the semiconductor chips 191 and 192. Various circuits may be formed in the body. A connection pad may be formed on the body, and the connection pad may include a conductive material such as aluminum (Al) or copper (Cu). Each of the semiconductor chips 191 and 192 may be a bare die. In this case, a metal bump may be disposed on the pad. Each of the semiconductor chips 191 and 192 may be a packaged die. In this case, an additional redistribution layer may be formed on a pad, and a metal bump may be disposed on the redistribution layer.

Each of the solder balls S may be formed of a low-melting-point metal, for example, a solder such as tin-aluminum-copper (Sn—Al—Cu), or the like. However, this is only an example and the material is not limited. Each of the solder balls S may be formed to have a multilayer structure or a single-layer structure. When each of the solder balls S is formed to have a multilayer structure, each of the solder balls S may include a copper pillar and a solder. When each of the solder balls S is formed to have a single-layer structure, each of the solder balls S may include a tin-silver solder or copper, but exemplary embodiments are not limited thereto.

Figure 11:
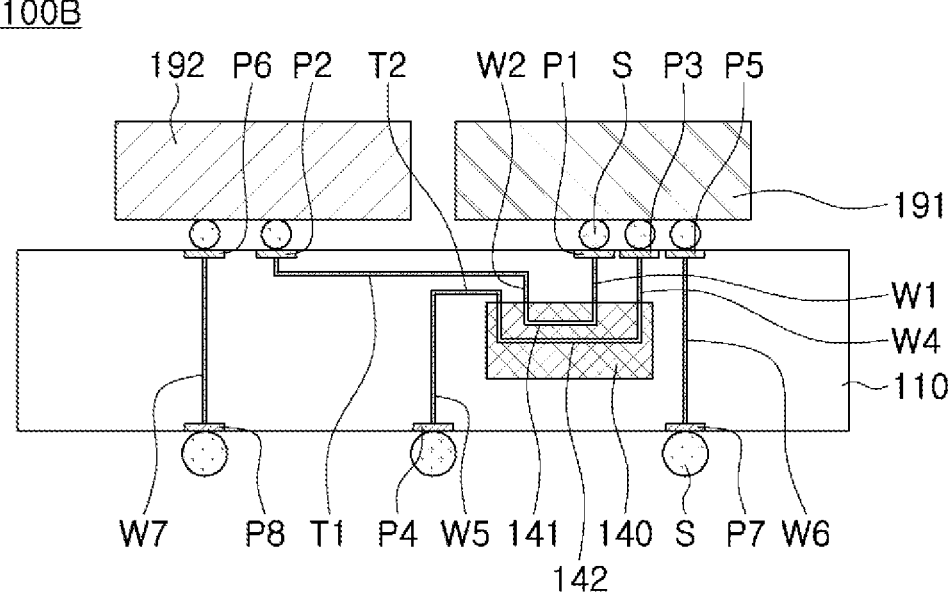
FIG. 11 is a schematic cross-sectional view illustrating a modified example of the printed circuit board of FIG. 6.

FIG. 11 is a schematic cross-sectional view illustrating a modified example of the printed circuit board of FIG. 6.

Figure 12:
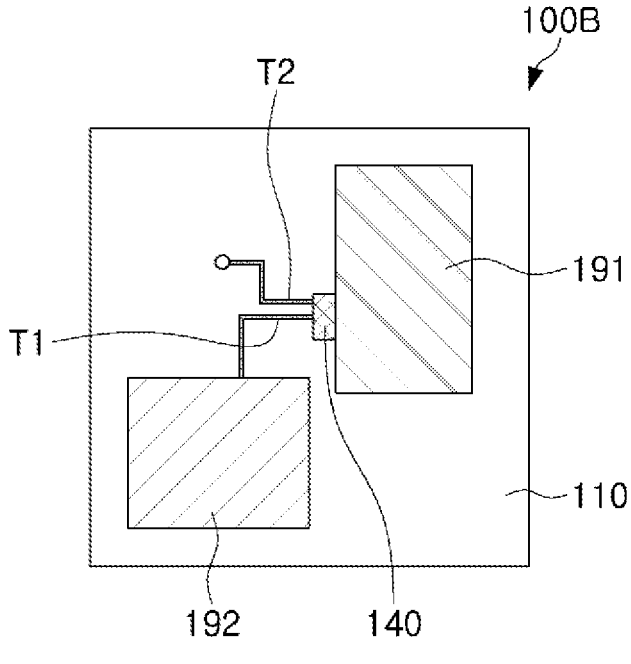
FIG. 12 is a schematic perspective plan view of the printed circuit board of FIG. 11.

FIG. 12 is a schematic perspective plan view of the printed circuit board of FIG. 11.

Referring to the drawings, a printed circuit board 100B according to a modified example may include a substrate 110, first to third pads P1, P2, and P3, respectively disposed on an upper side of the substrate 110, a fourth pad P4 disposed on a lower side of the substrate 110, a socket 140 disposed in the substrate 110 and including circuits 141 and 142, and first and second traces T1 and T2 disposed in the substrate 110 and disposed between the first to third pads P1, P2, and P3 and the socket 140 with respect to a lamination direction. The second trace T2 may be disposed above the socket 140 with respect to the lamination direction, and may be disposed between the third and fourth pads P3 and P4.

Among the circuits 141 and 142, at least a portion 141 may be electrically connected to the first and second pads P1 and P2 through first and second paths W1 and W2 in the substrate 110, respectively, and may be electrically connected to the second pad P2 through the second path W2 passing through at least the first trace T1. Among the circuits 141 and 142, at least another portion 142 may be electrically connected to third and fourth pads P3 and P4 through fourth and fifth paths W4 and W5 in the substrate 110, respectively, and may be electrically connected to the fourth pad P4 through a fifth path W5 passing through at least the second trace T2. Each of the first, second, fourth, and fifth paths W1, W2, W4, and W5 may include a trace, a pad, a via, or the like, and the trace, the pad, the via, or the like, may include a metal material. For example, each of the first and fourth paths W1 and W4 may include a pad, a via, or the like, and each of the second and fifth paths W2 and W5 may include a trace, a pad, a via, or the like, but exemplary embodiments are not limited thereto.

A first semiconductor chip 191, electrically connected to the first and third pads P1 and P3, and a second semiconductor chip 192, electrically connected to the second pad P2, may be disposed on the substrate 110. The first and second semiconductor chips 191 and 192 may be connected to the first to third pads P1, P2, and P3 through the solder balls S, but exemplary embodiments are not limited thereto. A solder ball S may be attached to the fourth pad P4, but exemplary embodiments are not limited thereto. As a result, the first and second semiconductor chips 191 and 192 may be electrically connected to each other through the first and second paths W1 and W2 and the socket 140. In addition, the first semiconductor chip 191 may be electrically connected to the lower side of the substrate 110 through the fourth and fifth paths W4 and W5 and the socket 140. When the first and second semiconductor chips 191 and 192 are mounted, the printed circuit board 100B may have a semiconductor package structure. With respect to the lamination direction, the socket 140 may at least partially overlap the first and third pads P1 and P3 and the first semiconductor chip 191, and may be spaced apart from the second pad P2 and the second semiconductor chip 192. For example, the second semiconductor chip 192 may be disposed to be spaced apart from the socket 140, resulting in an improved degree of freedom in disposition. In other words, the second semiconductor chip 192 may be disposed to be offset from the socket 140 with respect to the lamination direction. In one example, the second semiconductor chip 192 may not overlap the socket 140 with respect to the lamination direction.

The first and second semiconductor chips 191 and 192 may also be electrically connected to the fifth and sixth pads P5 and P6, disposed on the upper side of the substrate 110, respectively, and may be electrically connected to the seventh and eighth pads P7 and P8, disposed on the lower side of the substrate 110, through the sixth and seventh paths W6 and W7 in the substrate 110. Each of the sixth and seventh paths W6 and W7 may include a trace, a pad, a via, or the like, and the trace, the pad, the via, or the like, may include a metal material. For example, each of the sixth and seventh paths W6 and W7 may include a pad and a via, but exemplary embodiments are not limited thereto. A solder ball S may be attached to each of the fifth to eighth pads P5, P6, P7, and P8, but exemplary embodiments are not limited thereto.

Among the descriptions provided in the printed circuit boards 100A, 100A-1, 100A-2, and 100A-3, the descriptions that do not conflict with the following description may also be applied to the printed circuit board 100B.

Figure 13:
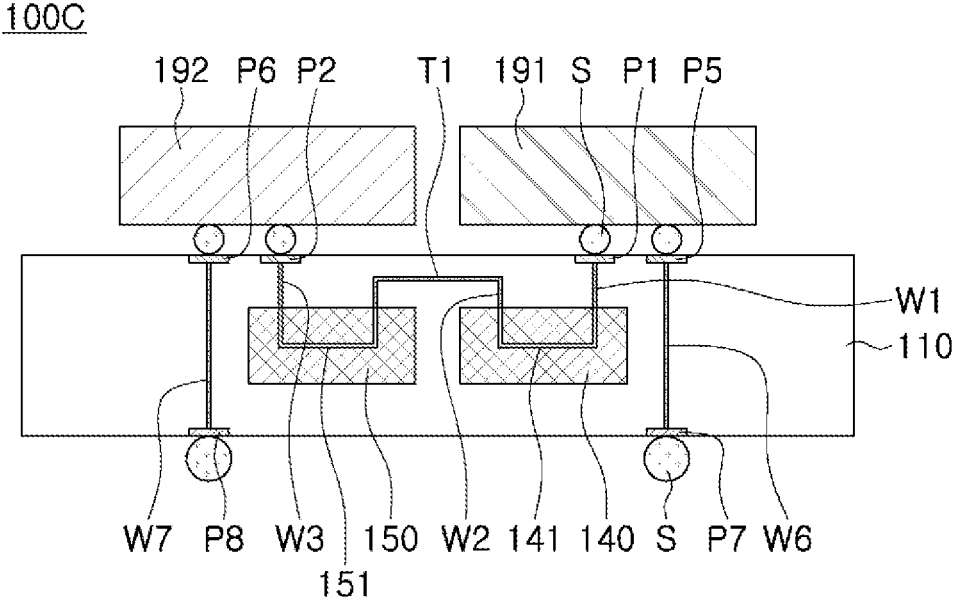
FIG. 13 is a schematic cross-sectional view illustrating another example of a printed circuit board.

FIG. 13 is a schematic cross-sectional view illustrating another example of a printed circuit board.

Figure 14:
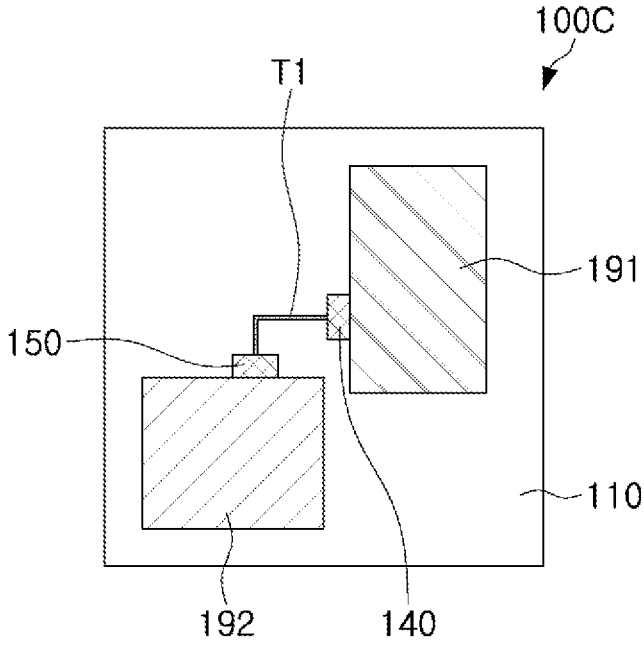
FIG. 14 is a schematic perspective plan view of the printed circuit board of FIG. 13.

FIG. 14 is a schematic perspective plan view of the printed circuit board of FIG. 13.

Referring to the drawings, a printed circuit board 100C according to another example may include a substrate 110, first and second pads P1 and P2, respectively disposed on an upper side of the substrate 110, a first socket 140 disposed in the substrate 110 and including a first circuit 141, a second socket 150 disposed in the substrate 110 and including a second circuit 151, and a first trace T1 disposed in the substrate 110 and disposed between the first and second pads P1 and P2 and the first and second sockets 140 and 150 with respect to a lamination direction. With respect to the lamination direction, the first and second sockets 140 and 150 may be disposed on substantially the same level, for example, on substantially the same layer.

At least a portion of the first circuit 141 may be electrically connected to the first and second pads P1 and P2 and the first to third paths W1, W2, and W3 in the substrate 110, respectively. At least a portion of the first pad P1 may be electrically connected to the second pad P2 through second and third paths W2 and W3 passing through at least the first trace T1. At least a portion of the second circuit 151 may be electrically connected to the first and second pads P1 and P2 through the first to third paths W1, W2, and W3 in the substrate 110, respectively, and may be connected to the first pad P1 through the first and second paths W1 and W2 passing through at least the first trace T1. The first trace T1 may electrically connect at least a portion of the first circuit 141 and at least a portion of the second circuit 151 to each other. Each of the first to third paths W1, W2, and W3 may include a trace, a pad, a via, or the like, and the trace, the pad, the via, or the like, may include a metal material. For example, each of the first and third paths W1 and W3 may include a pad and a via, and the second path W2 may include a trace, a pad, and a via, but exemplary embodiments are not limited thereto.

First and second semiconductor chips 191 and 192, respectively electrically connected to the first and second pads P1 and P2, may be disposed on the substrate 110. The first and second semiconductor chips 191 and 192 may be connected to the first and second pads P1 and P2 through the solder balls S, respectively, but exemplary embodiments are not limited thereto. As a result, the first and second semiconductor chips 191 and 192 may be electrically connected to each other through the first to third paths W1, W2, and W3 and the first and second sockets 140 and 150. When the first and second semiconductor chips 191 and 192 are mounted, the printed circuit board 100C may have a semiconductor package structure. With respect to the lamination direction, the first socket 140 may at least partially overlap the first pad P1 and the first semiconductor chip 191, and may be spaced apart from the second pad P2 and the second semiconductor chip 192. In addition, with respect to the lamination direction, the second socket 150 may at least partially overlap the second pad P2 and the second semiconductor chip 192, and may be spaced apart from the first pad P1 and the first semiconductor chip 191. For example, the first and second semiconductor chips 191 and 192 may be selectively disposed adjacent to only the first and second sockets 140 and 150, respectively, resulting in a further improved degree of freedom in disposition.

The first and second semiconductor chips 191 and 192 may also be electrically connected to the fifth and sixth pads P5 and P6 disposed on the upper side of the substrate 110, respectively, and may be electrically connected to the seventh and eighth pads P7 and P8 disposed on the lower side of the substrate 110 through the sixth and seventh paths W6 and W7, respectively. Each of the sixth and seventh paths W6 and W7 may include a trace, a pad, a via, or the like, and the trace, the pad, the via, or the like, may include a metal material. For example, each of the sixth and seventh paths W6 and W7 may include a pad and a via, but exemplary embodiments are not limited thereto. A solder ball S may be attached to each of the fifth to eighth pads P5, P6, P7, and P8, but exemplary embodiments are not limited thereto.

Figure 15:
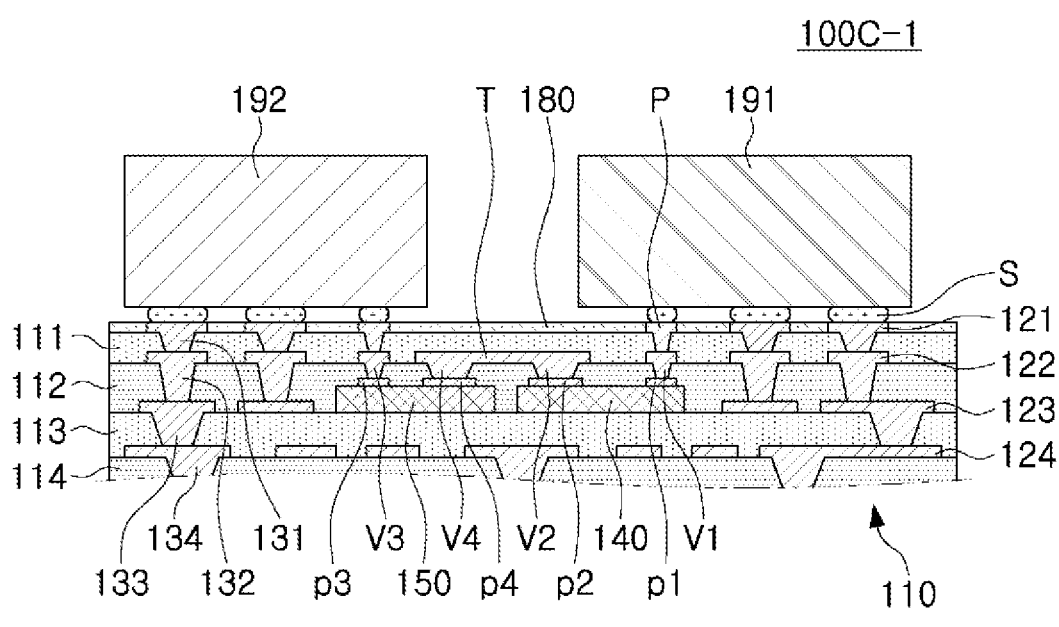
FIGS. 15 to 17 are schematic cross-sectional views illustrating various wiring structures of the printed circuit board of FIG. 13.
Figure 16:
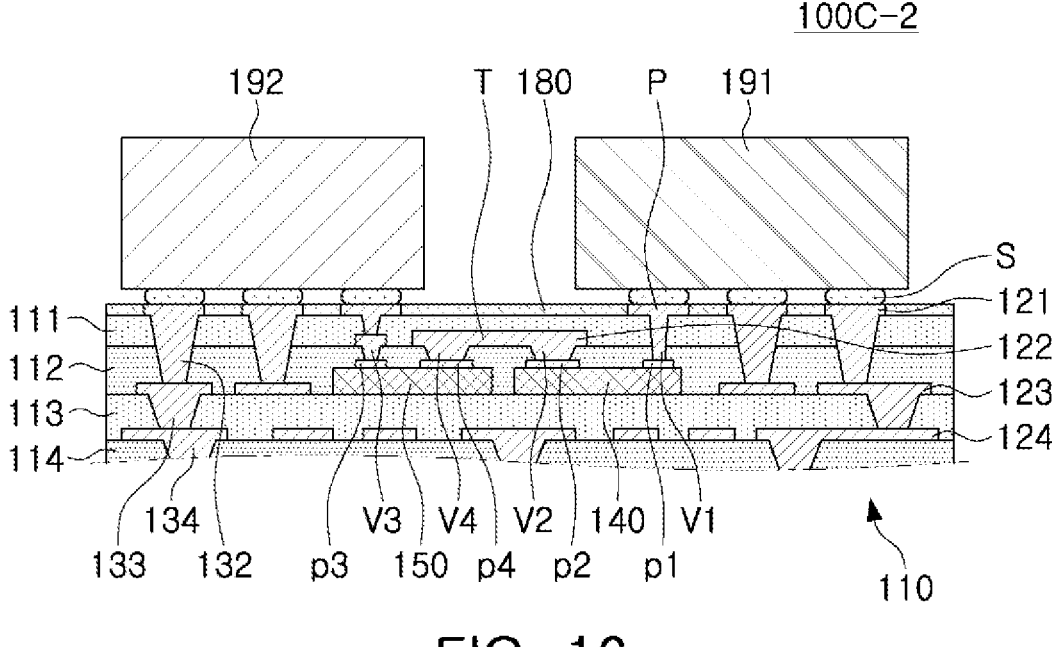
Figure 17:
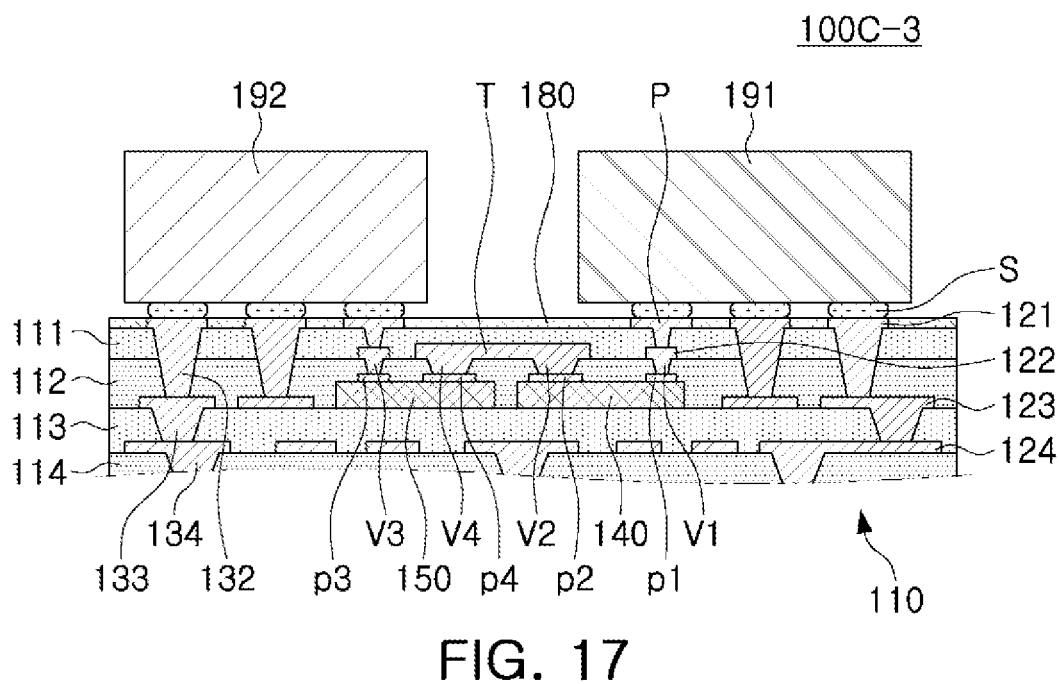

FIGS. 15 to 17 are schematic cross-sectional views illustrating various wiring structures of the printed circuit board of FIG. 13.

Referring to the drawings, printed circuit boards 100C-1, 100C-2, and 100C-3 according to various embodiments may include a substrate 110 including insulating layers 111, 112, 113, and 114, wiring layers 121, 122, 123, and 124, and via layers 131, 132, 133, and 134, a first socket 140 embedded in the substrate 110 and including first and second connection pads p1 and p2, and a second socket 150 embedded in the substrate 110 and including third and fourth connection pads p3 and p4. As necessary, the printed circuit boards 100C-1, 100C-2, and 100C-3 may further include a resist layer 180 disposed on the insulating layers 111, 112, 113, and 114. As necessary, the printed circuit boards 100C-1, 100C-2, and 100C-3 may further include first and second semiconductor chips 191 and 192, respectively mounted on the substrate 110 through solder balls S.

The wiring layers 121, 122, 123, and 124 may include a trace T. The via layers 131, 132, 133, and 134 may include first and second vias V1 and V2, respectively contacting the first and second connection pads p1 and p2, and third and fourth connection pads p3 and p4, respectively contacting the third and fourth vias V3 and V4. The second and fourth connection pads p2 and p4 may be electrically connected to the trace T through paths passing through at least the second and fourth vias V2 and V4, respectively. The first and third connection pads p1 and p3 may be electrically connected to the first and second semiconductor chips 191 and 192 through paths passing through at least the first and third vias V1 and V3, respectively.

The via layers 131, 132, 133, and 134 may be formed to have various shapes. For example, as in the printed circuit board 100C-1, each of the via layers 131, 132, 133, and 134 may be formed to penetrate through each of the insulating layers 111, 112, 113, and 114. Alternatively, as in the printed circuit board 100C-2, the first via layer 131 may be omitted, and a portion of the second via layer 132 may be formed to penetrate through the first and second insulating layers 111 and 112 in a batch. Alternatively, as in the printed circuit board 100C-3, a portion of the first via layer 131 and a portion of second via layer 132 may be formed to penetrate through the first and second insulating layers 111 and 112, respectively, and another portion of the second via layer 132 may be formed to penetrate through the first and second insulating layers 111 and 112 in a batch.

Each of the first to fourth vias V1, V2, V3, and V4 and the first to fourth connection pads p1, p2, p3, and p4 may be provided in plural. With respect to the lamination direction of the insulating layers 111, 112, 113, and 114, at least a portion of the plurality of first connection pads p1 may overlap the first semiconductor chip 191 and may be spaced apart from the second semiconductor chip 192, and at least a portion of the plurality of third connection pads p3 may overlap the second semiconductor chip 192 and may be spaced apart from the first semiconductor chip 191. As will be described later, the plurality of first connection pads p1 may be disposed to correspond to the plurality of first pads of the substrate, but may be disposed to not correspond to the plurality of second connection pads p2 of the substrate. In addition, the plurality of third connection pads p3 may be disposed to correspond to the plurality of second pads of the substrate, and the plurality of fourth connection pads p4 may be disposed to not correspond to the plurality of first pads of the substrate.

The above descriptions of the second socket 140 may be substantially equivalently applied to the second socket 150. In addition, among the descriptions of the printed circuit boards 100A, 100A-1, 100A-2, and 100A-3, the descriptions that do not conflict with the following description may also be applied to the printed circuit boards 100C-1, 100C-2, and 100C-3.

Figure 18:
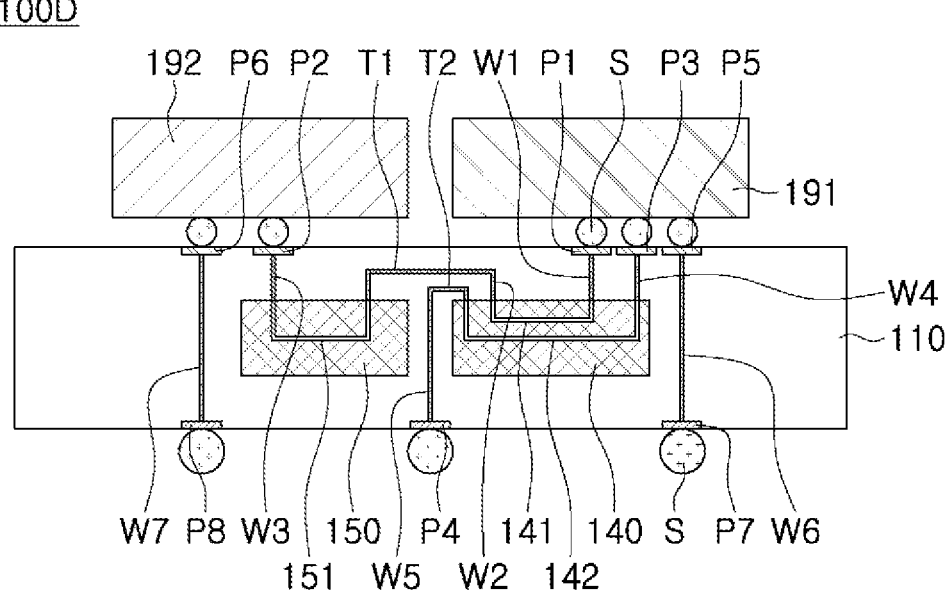
FIG. 18 is a schematic cross-sectional view illustrating a modified example of the printed circuit board of FIG. 13.

FIG. 18 is a schematic cross-sectional view illustrating a modified example of the printed circuit board of FIG. 13.

Figure 19:
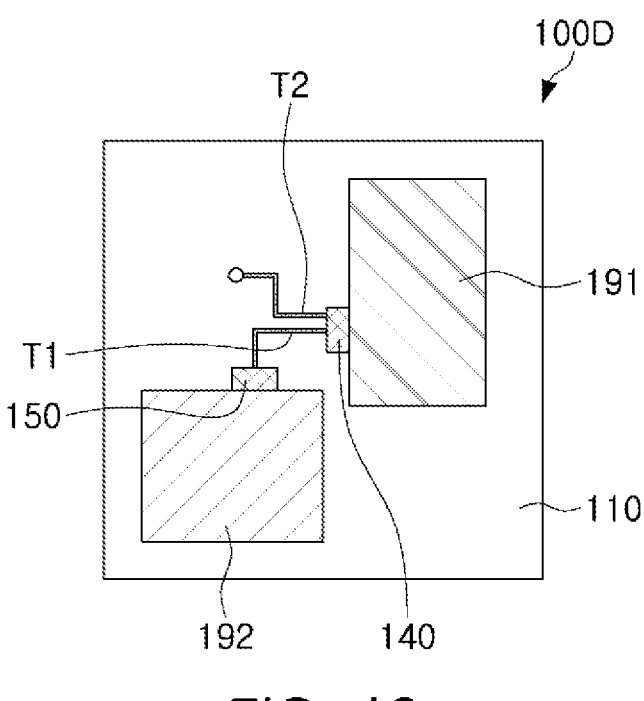
FIG. 19 is a schematic perspective plan view of the printed circuit board of FIG. 18.

FIG. 19 is a schematic perspective plan view of the printed circuit board of FIG. 18.

Referring to the drawings, a printed circuit board 100D according to a modified example may include a substrate 110, a first socket 140 including first to third pads P1, P2, and P3, respectively disposed on an upper side of the substrate 110, a fourth pad P4 disposed on a lower side of the substrate 110, and first circuits 141 and 142 disposed in the substrate 110, a second socket 150 disposed in the substrate 110 and including a second circuit 151, and first and second traces T1 and T2 disposed in the substrate 110 and disposed between the first to third pads P1, P2, and P3 and the first and second sockets 140 and 150 with respect to a lamination direction. The second trace T2 may be disposed above the first and second sockets 140 and 150 with respect to the lamination direction, and may be disposed between the third and fourth pads P3 and P4.

Among the first circuits 141 and 142, at least a portion 141 may be electrically connected to the first and second pads P1 and P2 through first to third paths W1, W2, and W3 in the substrate 110, respectively, and may be electrically connected to the second pad P2 through the second and third paths W2 and W3 passing through at least the first trace T1. Among the first circuits 141 and 142, at least another portion 142 may be electrically connected to the third and fourth pads P3 and P4 through fourth and fifth paths W4 and W5 in the substrate 110, respectively, and may be electrically connected to the fourth pad P4 through the fifth path W5 passing through at least the second trace T2. At least a portion of the second circuit 151 may be electrically connected to the first and second pads P1 and P2 through the first to third paths W1, W2, and W3 in the substrate 110, respectively, and may be electrically connected to the first pad P1 through the first and second paths W1 and W2 passing through at least the first trace T1. Each of the first to fifth paths W1, W2, W3, W4, and W5 may include a trace, a pad, a via, or the like, and the trace, the pad, the via, or the like, may include a metal material. For example, each of the first, third, and fourth paths W1, W3, and W4 may include a pad and a via, and each of the second and fifth paths W2 and W5 may include a trace, a pad, and a via, but exemplary embodiments are not limited thereto.

A first semiconductor chip 191, electrically connected to the first and third pads P1 and P3, and a second semiconductor chip 192, electrically connected to the second pad P2, may be disposed on the substrate 110. The first and second semiconductor chips 191 and 192 may be connected to the first to third pads P1, P2, and P3 through the solder balls S, but exemplary embodiments are not limited thereto. The solder ball S may be attached to the fourth pad P4, but exemplary embodiments are not limited thereto. As a result, the first and second semiconductor chips 191 and 192 may be electrically connected to each other through the first to third paths W1, W2, and W3 and the first and second sockets 140 and 150. In addition, the first semiconductor chip 191 may be electrically connected to the lower side of the substrate 110 through the fourth and fifth paths W4 and W5 and the first socket 140. When the first and second semiconductor chips 191 and 192 are mounted, the printed circuit board 100D may have a semiconductor package structure. With respect to the lamination direction, the first socket 140 may at least partially overlap the first and third pads P1 and P3 and the first semiconductor chip 191 and may be spaced apart from the second pad P2 and the second semiconductor chip 192. In addition, the second socket 150 may at least partially overlap the second pad P2 and the second semiconductor chip 192 and may be spaced apart from the first and third pads P1 and P3 and the first semiconductor chip 191. For example, the first and second semiconductor chips 191 and 192 may be selectively disposed adjacent to only the first and second sockets 140 and 150, respectively, resulting in an improved degree of freedom of disposition.

The first and second semiconductor chips 191 and 192 may also be electrically connected to the fifth and sixth pads P5 and P6, disposed on the upper side of the substrate 110, respectively, and may be electrically connected to the seventh and eighth pads P7 and P8, disposed on a lower side of the substrate 110, through the sixth and seventh paths W6 and W7, respectively. Each of the sixth and seventh paths W6 and W7 may include a trace, a pad, a via, or the like, and the trace, the pad, the via, or the like, may include a metal material. For example, each of the sixth and seventh paths W6 and W7 may include a pad and a via, but exemplary embodiments are not limited thereto. The solder ball S may be attached to each of the fifth to eighth pads P5, P6, P7, and P8, but exemplary embodiments are not limited thereto.

In addition, among the descriptions of the printed circuit boards 100A, 100A-1, 100A-2, 100A-3, 100B, 100C, 100C-1, 100C-2, and 100C-3, the descriptions that do not conflict with the following description may also be applied to the printed circuit board 100D.

FIGS. 20 to 23 are schematic perspective plan views illustrating other examples of a printed circuit board.

Referring to the drawings, printed circuit boards 100E, 100F, 100G, and 100H according to another example may include a substrate 110 on which a third semiconductor chip 193 is further disposed. In this case, first and third semiconductor chips 191 and 193 may be electrically connected to each other through the above-described connection path.

Figure 20:
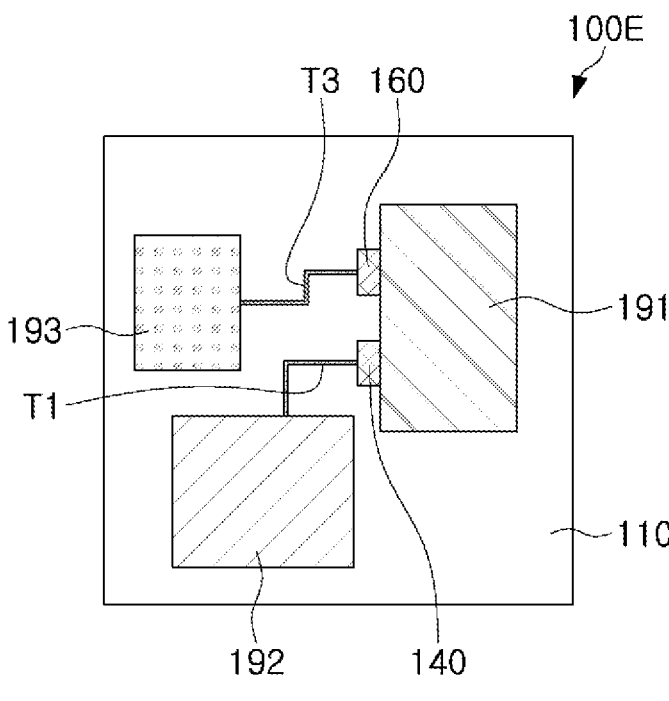
FIGS. 20 to 23 are schematic perspective plan views illustrating other examples of a printed circuit board.

For example, as illustrated in FIG. 20, similarly to the printed circuit board 100A, in the printed circuit board 100E according to another example, the first and second semiconductor chips 191 and 192 may be electrically connected to a first socket 140 in the substrate 110 through a first trace T1, but a third socket 160 may be further disposed adjacent to the first semiconductor chip 191, and the first and third semiconductor chips 191 and 193 may be electrically connected to each other through the third socket 160 and a third trace T3 in the substrate 110. The above descriptions of the first socket 140 and the first trace T1 may be applied to a detailed descriptions of the third socket 160 and the third trace T3. The above description of the second semiconductor chip 192 may be applied to a detailed description of the third semiconductor chip 193.

Figure 21:
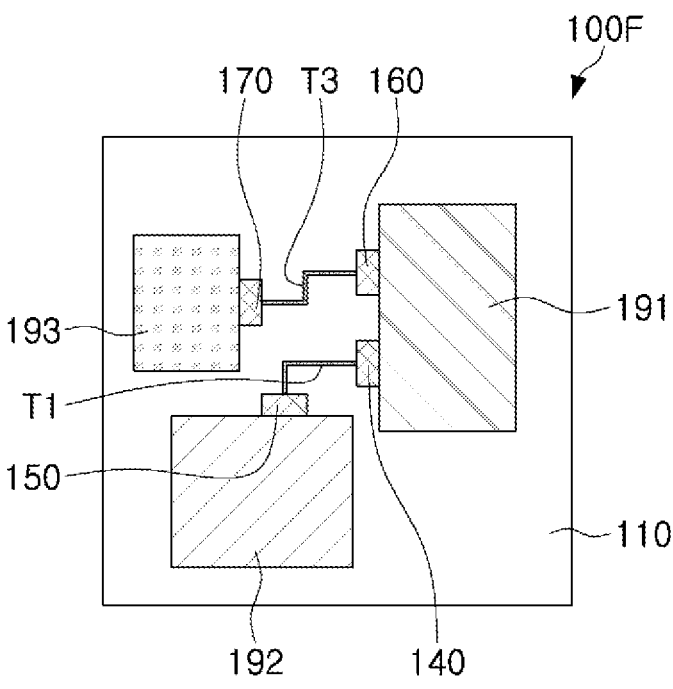

Alternatively, as illustrated in FIG. 21, similarly to the printed circuit board 100B, in a printed circuit board 100F according to another example, first and second semiconductor chips 191 and 192 may be electrically connected to each other through first and second sockets 140 and 150 in a substrate 110 and a first trace T1, but third and fourth sockets 160 and 170 may be further disposed adjacent to the first and third semiconductor chips 191 and 193, respectively, and the first and third semiconductor chips 191 and 193 may be electrically connected to each other through third and fourth sockets 160 and 170 and a third trace T3 in the substrate 110. The above descriptions of the first and second sockets 140 and 150 and the first trace T1 may be applied to a detailed descriptions of the third and fourth sockets 160 and 170 and the third trace T3. The above description of the second semiconductor chip 192 may be applied to a detailed description of the third semiconductor chip 193.

Figure 22:
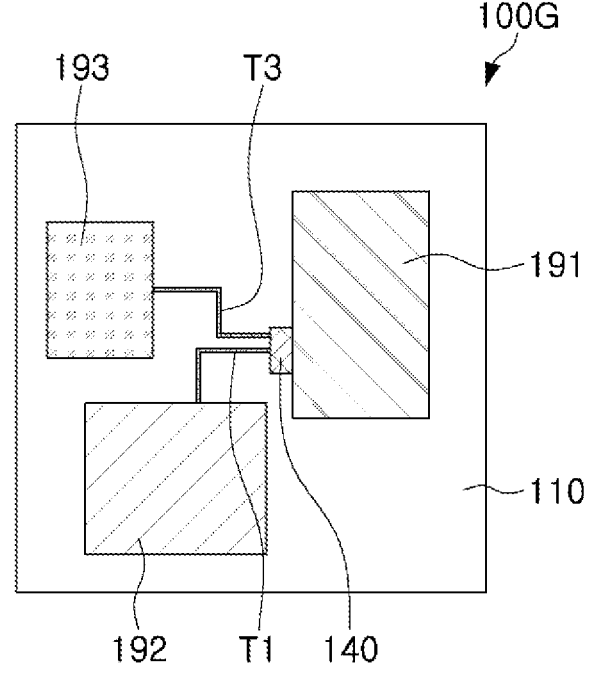

Alternatively, as illustrated in FIG. 22, similarly to the printed circuit board 100A, in a printed circuit board 100G according to another example, first and second semiconductor chips 191 and 192 may be electrically connected to each other through a first socket 140 and a first trace T1 in a substrate 110, but first and third semiconductor chips 191 and 193 may be electrically connected to each other through the first socket 140 and a third trace T3 in the substrate 110. The first socket 140 may include a plurality of circuits, and each of the first and third traces T1 and T3 may be electrically connected to different circuits, among the plurality of circuits. The above descriptions of the first trace T1 may be applied to a detailed description of the third trace T3. The above description of the second semiconductor chip 192 may be applied to a detailed description of the third semiconductor chip 193.

Figure 23:
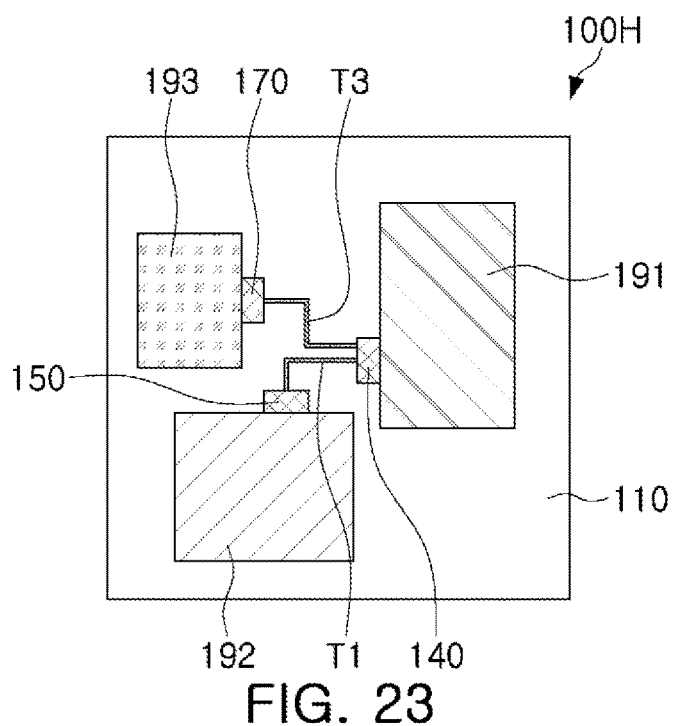

Alternatively, as illustrated in FIG. 23, similarly to the printed circuit board 100B, in a printed circuit board 100H according to another example, first and second semiconductor chips 191 and 192 may be electrically connected to each other through first and second sockets 140 and 150 in a substrate 110 and a first trace T1, but a fourth socket 170 may be further disposed adjacent to a third semiconductor chip 193, and first and third semiconductor chips 191 and 193 may be electrically connected to each other through the first and fourth sockets 140 and 170 and the a trace T3 in the substrate 110. The above descriptions of the second socket 150 and the first trace T1 may be applied to detailed descriptions of the fourth socket 170 and the third trace T3. The above description of the second semiconductor chip 192 may be applied to a detailed description of the third semiconductor chip 193.

Among the descriptions provided in the printed circuit boards 100A, 100A-1, 100A-2, 100A-3, 100B, 100C, 100C-1, 100C-2, 100C-3, and 100D, the descriptions that do not conflict with the following description may also be applied to the printed circuit boards 100E, 100F, 100G, and 100H.

Figure 24:
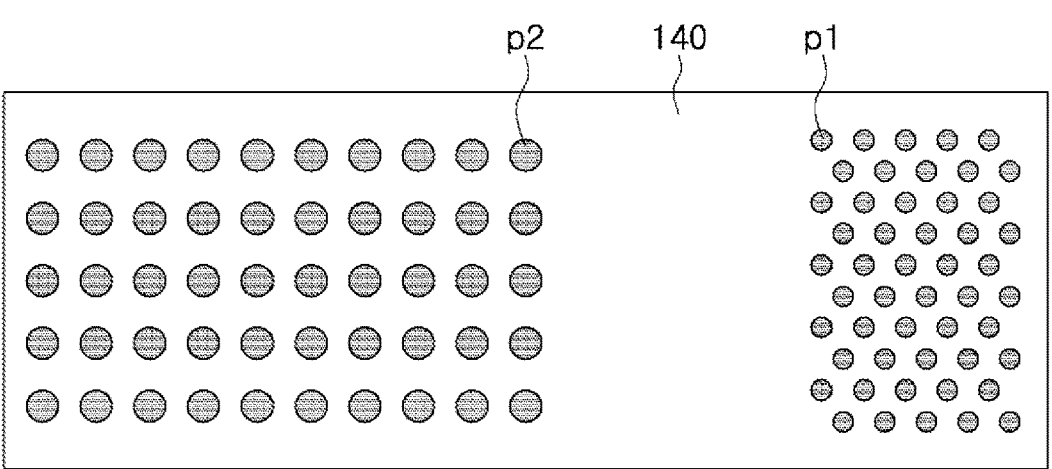
FIG. 24 is a schematic plan view illustrating a disposition of a connection pad of a socket.

FIG. 24 is a schematic plan view illustrating a disposition of a connection pad of a socket.

Figure 25:
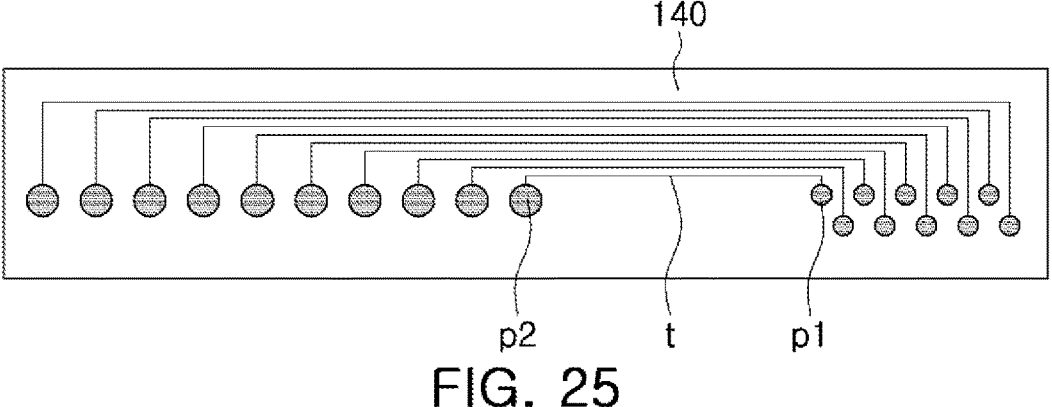
FIG. 25 is a schematic perspective plan view illustrating electrical connection between at least portions of the connection pad of the socket of FIG. 24.

FIG. 25 is a schematic perspective plan view illustrating electrical connection between at least portions of the connection pad of the socket of FIG. 24.

Referring to the drawings, a socket 140 may include a plurality of first connection pads p1 and a plurality of second connection pads p2. The plurality of first connection pads p1 may be connected to a semiconductor chip, and the plurality of second connection pads p2 may be connected to a trace of the substrate. Accordingly, design rules of the plurality of first connection pads p1 and the plurality of second connection pads p2 may be different from each other. For example, the plurality of first connection pads p1 may have a density, higher than a density of the plurality of second connection pads p2. In this regard, each of the second connection pads p2 may have an area, larger than each of the first connection pads p1, in a plane. In addition, an average pitch between the plurality of first connection pads p2 may be greater than an average pitch between the plurality of first connection pads p1. The plurality of first connection pads p1 may be electrically connected to the plurality of second connection pads p2 through traces t in the socket 140, respectively.

The plurality of first connection pads p1 may be disposed to correspond to a plurality of first pads of the substrate connected thereto and a plurality of first connection pads of a first semiconductor chip connected thereto. The phrase "disposed to correspond" may mean that arrangements, pitches, orders, and the like, of the pads may be substantially the same. On the other hand, the plurality of second connection pads p2 may be disposed to not correspond to a plurality of second pads of the substrate connected thereto and a plurality of second connection pads of a second semiconductor chip connected thereto. The phrase "disposed to not correspond" may mean that arrangements, pitches, orders, and the like, of the pads may be different from each other.

The above description of the socket 140 may be applied to the above-described printed circuit boards 100A, 100A-1, 100A-2, 100A-3, 100B, 100C, 100C-1, 100C-2, 100C-3, 100D, 100E, 100F, and 100G. In this case, the above description of the socket 140 may also be substantially equivalently applied to the above-described sockets 150, 160, and 170.

As necessary, an average pitch of the plurality of connection pads connected to the semiconductor chip of the socket 140 may be different from an average pitch of the plurality of connection pads, respectively connected to semiconductor chips of the sockets 150, 160, and 170, but exemplary embodiments not limited thereto.

As described above, a printed circuit board, in which a socket for increasing the degree of freedom in disposition of a die (or a semiconductor chip) is embedded, may be provided.

In the present disclosure, "in a cross-section" may refer to a cross-sectional shape when an object is vertically taken, or a cross-sectional shape when the object is viewed from side. In addition, "in a plane" may refer to a shape when the object is horizontally taken, or a planar shape when the object is viewed from above or below. In addition, "in a lamination direction" may refer to an upper side direction or a lower side direction on a cross-section.

In the present disclosure, a pitch may be measured by capturing an image in a cross-section or a plane with a scanning microscope, an optical microscope, or the like, and an average pitch may be an average value of pitches between wirings, circuits, or pads measured at five arbitrary points. An interlayer insulation distance may also be measured by capturing an image in a cross-section or a plane with a scanning microscope, an optical microscope, or the like, and an average interlayer insulation distance may be an average value of insulation distances between adjacent wirings, circuits, or pads measured at five arbitrary points.

In the present disclosure, an area may be measured by capturing an image in a plane with a scanning microscope, an optical microscope, or the like. In this case, when a difference in areas is large, a large-and-small relationship may be determined by observing the areas with eyes. Meanwhile, when the difference is small, the large-and-small relationship may be determined by calculating the areas through a numerical value such as a diameter, or the like. When there are a plurality of comparison targets, a large-and-small relationship between areas may be determined by an average area of each of the comparison targets. For example, the large-and-small relationship between areas may be determined by calculating an average value of five arbitrary areas of each of the comparison targets.

In the present disclosure, the term "substantially" may refer to a concept including a minute difference caused by a process error. For example, "substantially the same" may include not only a case of being completely the same, but also a case of having a minute difference caused by a process error. In addition, "portions are disposed on substantially the same level" may mean that half or more of portions horizontally overlap each other in a cross-section.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not always refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than to limit the present disclosure. In this case, singular forms include plural forms unless necessarily interpreted otherwise, based on a particular context.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
   a substrate;
   a first pad and a second pad, respectively disposed on an upper side of the substrate;
   a first socket disposed in the substrate and including a first circuit;
   a second socket embedded in the substrate and including a second circuit; and
   a first trace disposed in the substrate and disposed between the first socket and at least one of the first and second pads with respect to a lamination direction of insulating layers of the substrate,
   wherein at least a portion of the first circuit is connected to each of the first and second pads, and is connected to the second pad through a path passing through the first trace.

2. The printed circuit board of claim 1, wherein the first socket at least partially overlaps the first pad and is spaced apart from the second pad, with respect to the lamination direction.

3. The printed circuit board of claim 1, further comprising:
   a first semiconductor chip and a second semiconductor chip, respectively disposed on the substrate and respectively connected to the first and second pads, wherein the first socket at least partially overlaps the first semiconductor chip and is spaced apart from the second semiconductor chip, with respect to the lamination direction.

4. The printed circuit board of claim 1, further comprising:

a third pad disposed on the upper side of the substrate;

a fourth pad disposed on a lower side of the substrate opposing the upper side; and a second trace disposed in the substrate, and disposed between the third and fourth pads in the lamination direction, wherein another portion of the first circuit is connected to each of the third and fourth pads, and is connected to the fourth pads through a path passing through at least the second trace.

5. The printed circuit board of claim 1, wherein at least a portion of the second circuit is connected to each of the first and second pads, and is connected to the first pad through a path passing through at least the first trace.

6. The printed circuit board of claim 5, wherein the first trace connects at least a portion of the first circuit and at least a portion of the second circuit to each other.

7. The printed circuit board of claim 5, wherein the first and second sockets are disposed on substantially the same level, with respect to the lamination direction.

8. The printed circuit board of claim 5, further comprising:

a first semiconductor chip and a second semiconductor chip, respectively disposed on the substrate and respectively connected to the first and second pads, wherein the first socket at least partially overlaps the first semiconductor chip and is spaced apart from the second semiconductor chip, with respect to the lamination direction, and the second socket at least partially overlaps the second semiconductor chip and is spaced apart from the first semiconductor chip, with respect to the lamination direction.

9. The printed circuit board of claim 5, further comprising:

a third pad disposed on the upper side of the substrate;

a fourth pad disposed on a lower side of the substrate opposing the lower side; and a second trace disposed in the substrate, and disposed between the third and fourth pads with respect to the lamination direction, wherein another portion of the first circuit is connected to each of the third and fourth pads and is connected to a path passing through at least the second trace.

10. A printed circuit board comprising:

a substrate including insulating layers, a wiring layer, and a via layer; and a first socket embedded in the substrate and including a first circuit, wherein the via layer includes a plurality of first vias and a plurality of second vias, the first socket includes a plurality of first connection pads and a plurality of second connection pads, the plurality of first vias and the plurality of second vias contact the plurality of first connection pads and the plurality of second connection pads, respectively, and an average pitch between the plurality of second connection pads is greater than an average pitch between the plurality of first connection pads.

11. The printed circuit board of claim 10, wherein at least one of the plurality first connection pads and at least one of the plurality of second connection pads are connected to each other through at least a portion of the first circuit.

12. The printed circuit board of claim 10, wherein each of the plurality of second connection pads has an area, larger than an area of each of the plurality of first connection pads.

13. The printed circuit board of claim 10, further comprising:

a first semiconductor chip and a second semiconductor chip, respectively mounted on the substrate, wherein the wiring layer includes a trace, at least one of the plurality of first connection pads is connected to the first semiconductor chip through a path passing through at least the plurality of first vias, at least one of the plurality of second connection pads is connected to the trace through a path passing through at least the plurality of second vias, and the trace is connected to the second semiconductor chip.

14. The printed circuit board of claim 13, wherein the wiring layer includes a plurality of first pads and a plurality of second pads, the plurality of first semiconductor chips and the plurality of second semiconductor chips are connected to the plurality of first pads and the plurality of second pads, respectively, and the plurality of first connection pads are disposed to correspond to the plurality of first pads, and the plurality of second connection pads are disposed to not correspond to the plurality of second pads.

15. The printed circuit board of claim 13, wherein at least a portion of the plurality of first connection pads overlap the first semiconductor chip and is spaced apart from the second semiconductor chip, with respect to a lamination direction of the insulating layers of the substrate.

16. The printed circuit board of claim 10, further comprising:

a second socket embedded in the substrate and including a second circuit, wherein the via layer further includes a plurality of third vias and a plurality of fourth vias, the second socket includes a plurality of third connection pads and a plurality of fourth connection pads, the plurality of third vias and the plurality of fourth vias contact the plurality of third connection pads and the plurality of fourth connection pads, respectively, and an average pitch between the plurality of fourth connection pads is greater than an average pitch between the plurality of third connection pads.

17. The printed circuit board of claim 16, wherein at least one of the plurality of third connection pads and at least one of the plurality of fourth connection pads are connected to each other through at least a portion of the second circuit.

18. The printed circuit board of claim 16, further comprising:

a first semiconductor chip and a second semiconductor chip, respectively mounted on the substrate, the wiring layer includes a trace, at least one of the plurality of first connection pads is connected to the first semiconductor chip through a path passing through at least the first via, at least one of the plurality of second connection pads is connected to the trace through a path passing through at least the second via, at least one of plurality of third connection pads is connected to the second semiconductor chip through a path passing through at least the third via, and at least one of the plurality of fourth connection pads is connected to the trace through a path passing through at least the fourth via.

19. The printed circuit board of claim 18, wherein the wiring layer includes a plurality of first pads and a plurality of second pads, the first semiconductor chip and the second semiconductor chip are connected to the plurality of first pads and the plurality of second pads, respectively, and the plurality of first connection pads and the plurality of third connection pads are disposed to correspond to the plurality of first pads and the plurality of second pads, respectively, and, the plurality of second connection pads and the plurality of fourth connection pads are disposed to not correspond to the plurality of second pads and the plurality of first pads, respectively.

20. The printed circuit board of claim 18, wherein at least a portion of the plurality of first connection pads overlaps the first semiconductor chip and is spaced apart from the second semiconductor chip, and at least a portion of the plurality of third connection pads overlaps the second semiconductor chip and is spaced apart from the first semiconductor chip, with respect to a lamination direction of the insulating layers of the substrate.

21. A printed circuit board comprising:

a substrate including insulting layers;

a plurality of pads disposed on one surface of the substrate; and a socket disposed in the substrate and including a plurality of connection pads disposed on a surface of the socket, wherein the plurality of connection pads include a first connection pad connected to a first pad of the plurality of pads through a path extending in a lamination direction of the insulating layers, and a second connection pad connected to a second pad of the plurality of pads, and the second connection pad is offset from the plurality of pads in the lamination direction.

22. The printed circuit board of claim 21, wherein the path extending in the lamination direction includes one or more vias of the substrate stacked on each other in the lamination direction.

23. The printed circuit board of claim 21, wherein the second connection pad is connected to the second pad at least through two vias offset from each other in the lamination direction.

24. The printed circuit board of claim 23, wherein the substrate comprises a wiring layer including a wiring pattern extending between the two vias.

25. The printed circuit board of claim 21, further comprising:

a first semiconductor chip and a second semiconductor chip, respectively disposed on the substrate and respectively connected to the first and second pads, wherein the socket at least partially overlaps the first semiconductor chip and is offset from the second semiconductor chip, with respect to the lamination direction.

26. The printed circuit board of claim 21, wherein an average pitch between connection pads, among the plurality of connection pads, located in a region of the socket where the first connection pad is disposed, is less than an average pitch between connection pads, among the plurality of connection pads, located in another region of the socket where the second connection pad is disposed.

* * * * *